US012560664B2

(12) United States Patent
Aghaeifar et al.

(10) Patent No.: US 12,560,664 B2
(45) Date of Patent: Feb. 24, 2026

(54) SUBJECT-SPECIFIC OPTIMIZATION OF AN RF PULSE FOR EXCITING THE SPINS IN A SLAB

(71) Applicant: Siemens Healthcare GmbH, Erlangen (DE)

(72) Inventors: Ali Aghaeifar, Tübingen (DE); Belinda Ding Yuan, Glasgow (GB); Raphael Tomi-Tricot, London (GB); Iulius Dragonu, Harrow (GB); Radhouene Neji, London (GB)

(73) Assignee: Siemens Healthineers AG, Forchheim (DE)

( * ) Notice: Subject to any disclaimer, the term of this patent is extended or adjusted under 35 U.S.C. 154(b) by 177 days.

(21) Appl. No.: 18/244,282

(22) Filed: Sep. 10, 2023

(65) Prior Publication Data

US 2024/0085506 A1    Mar. 14, 2024

(30) Foreign Application Priority Data

Sep. 9, 2022    (EP) .................................... 22194853

(51) Int. Cl.
| | |
|---|---|
| *G01R 33/54* | (2006.01) |
| *G01R 33/24* | (2006.01) |
| *G01R 33/3875* | (2006.01) |
| *G01R 33/483* | (2006.01) |
| *G01R 33/565* | (2006.01) |

(52) U.S. Cl.
CPC ......... *G01R 33/543* (2013.01); *G01R 33/246* (2013.01); *G01R 33/3875* (2013.01); *G01R 33/4835* (2013.01); *G01R 33/5659* (2013.01)

(58) Field of Classification Search
CPC  G01R 33/543; G01R 33/246; G01R 33/3875; G01R 33/4835; G01R 33/5659
See application file for complete search history.

(56) References Cited

U.S. PATENT DOCUMENTS

2015/0362574 A1* 12/2015 Wu ........................ A61B 5/055
324/322

OTHER PUBLICATIONS

Heverhagen, Johannes T., et al. "Time-of-flight magnetic resonance angiography at 7 Tesla." Investigative radiology 43.8 (2008): 568-573.
Mao, Weihua, Michael B. Smith, and Christopher M. Collins. "Exploring the limits of RF shimming for high-field MRI of the human head." Magnetic Resonance in Medicine: an Official Journal of the International Society for Magnetic Resonance in Medicine 56.4 (2006): 918-922.

(Continued)

*Primary Examiner* — Rishi R Patel
(74) *Attorney, Agent, or Firm* — Lempia Summerfield Katz LLC

(57) ABSTRACT

A method for optimization of an RF pulse for exciting spins in a slab in a magnetic resonance examination is provided. The RF pulse is to be played out with a coil having a plurality of independent parallel transmit elements. The method includes receiving complex B1+ field sensitivity maps for the plurality of parallel transmit elements and dividing the slab into at least two sub-slabs. For each sub-slab, B1+ shimming is performed to optimize the RF shim settings for the plurality of parallel transmit elements. The optimized RF shim settings are combined for each sub-slab to create a multiband RF pulse that simultaneously excites the spins in the complete slab.

16 Claims, 5 Drawing Sheets

(56) References Cited

OTHER PUBLICATIONS

Parker, Dennis L., Chun Yuan, and Duane D. Blatter. "MR angiography by multiple thin slab 3D acquisition." Magnetic resonance in medicine 17.2 (1991): 434-451.

Saïb, Gaël, et al. "Time-of-flight angiography at 7T using TONE double spokes with parallel transmission." Magnetic Resonance Imaging 61 (2019): 104-115.

Schmitter, Sebastian, et al. "Cerebral TOF angiography at 7T: Impact of B1+ shimming with a 16-channel transceiver array." Magnetic resonance in medicine 71.3 (2014): 966-977.

Schmitter, Sebastian, et al. "Contrast enhancement in TOF cerebral angiography at 7 T using saturation and MT pulses under SAR constraints: impact of VERSE and sparse pulses." Magnetic resonance in medicine 68.1 (2012): 188-197.

Schmitter, Sebastian, et al. "Seven-tesla time-of-flight angiography using a 16-channel parallel transmit system with power-constrained 3-dimensional spoke radiofrequency pulse design." Investigative radiology 49.5 (2014): 314.

Schmitter, Sebastian, et al. "Slab selective pTX Multiband TOF Angiography at 7 Tesla." proceedings ISMRM. 2015. 0542.

Setsompop, Kawin. Design algorithms for parallel transmission in magnetic resonance imaging. Diss. Massachusetts Institute of Technology, 2008. pp. 1-158.

Shao, Xin, et al. "Parallel transmission RF pulse design for simultaneous multi-slab excitation at 7 Tesla: a simulation study." Proc. Intl. Soc. Mag. Reson. Med. 30 (2022) 3236.

Van de Moortele, Pierre-François, et al. "Calibration tools for RF shim at very high field with multiple element RF coils: from ultra fast local relative phase to absolute magnitude B1+ mapping." Proc Intl Soc Mag Reson Med. vol. 15. 2007. 1676.

Wu, Xiaoping, et al. "A generalized slab-wise framework for parallel transmit multiband RF pulse design." Magnetic resonance in medicine 75.4 (2016): 1444-1456.

Wu, Xiaoping, et al. "Simultaneous multislice multiband parallel radiofrequency excitation with independent slice- specific transmit B1 homogenization." Magnetic resonance in medicine 70.3 (2013): 630-638.

* cited by examiner

Frequency [kHz]

Time [ms]

Frequency [kHz]

Time [ms]

SUBJECT-SPECIFIC OPTIMIZATION OF AN RF PULSE FOR EXCITING THE SPINS IN A SLAB

This application claims the benefit of European Patent Application No. EP 22194853, filed on Sep. 9, 2022, which is hereby incorporated by reference in its entirety.

BACKGROUND

The present embodiments are directed to a method for subject-specific optimization of an RF pulse for exciting spins in a slab in a magnetic resonance examination, to a method for acquiring magnetic resonance data, a computer program, a non-transient computer-readable medium, a control unit, and a magnetic resonance imaging system.

Ultra-high-field (UHF) magnetic resonance imaging (MRI) at field strengths of 7 Tesla or more offers various advantages, such as a higher signal-to-noise ratio, higher spectral resolutions, or in many cases, also a stronger contrast. At the same time, UHF MRI entails problems that are mostly due to the higher frequency of the electromagnetic radio frequency (RF) pulses and the resultant shorter RF wavelengths. The shorter wavelengths result in increased inhomogeneity in the transverse RF field, the so-called B1+ field, which is responsible for excitation of the spins. This leads to spatially varying flip angles of the spins and thus to inhomogeneous image contrast.

To overcome these problems, dynamic and static excitation techniques are used, which are based on the principle of parallel transmission (pTx) and use coils with a number of independent transmit (Tx) elements (e.g., 8, 16 or 32 Tx elements). Each transmit element has a different complex B1+ field distribution. The overall B1+ field, which determines the flip angle (FA), thus corresponds to the superimposed B1+ fields from the multiple Tx elements. The overall B1+ field may be modified by varying the magnitude and/or phase of the individually applied RF pulses, which then scales or phase shifts the individual B1+ fields. The vector of $N_{Tx}$ phases and $N_{Tx}$ amplitudes for $N_{Tx}$ independent transmit elements of a coil may be referred to as the B1+ shim setting. In static B1+ shimming, these B1+ shim settings are held constant during the RF pulse, whereas in dynamic parallel transmission or dynamic B1+ shimming, the shim settings change as a function of time as the RF pulse is played out. The goal of B1+ shimming is to optimize the resulting B1+ field or flip angle distribution so that it matches a predefined spatial pattern (e.g., a homogeneous B1+ field or field).

It has been shown that non-contrast-enhanced time-of-flight (TOF) magnetic resonance (MR) angiography techniques especially benefit from ultra-high field (UHF) MM, because of longer T1 relaxation and improved signal-to-noise ratios (SNR). Longer T1 at UHF MM allows a better suppression of the surrounding stationary tissue, which yields a better vessel-to-background contrast. However, at 7T, shorter RF wavelengths result in increased B1+ inhomogeneity and cause undesired contrast and signal variation.

TOF MRA is widely used for intracranial applications, and B1+ inhomogeneity degrades the visualization of the finer intracranial vasculature. In conventional single transmission (sTX) systems, B1+ magnitude is stronger in the center of brain and weakens towards the periphery. It has been attempted to overcome these RF heterogeneities by using parallel transmission (pTx) using static B1+ shimming, as described in Schmitter, S. et al., Cerebral TOF angiography at 7T: Impact of B1+ shimming with a 16-channel transceiver array, *Magn. Reson. Med.* 71, 966-977 (2014).

The B1+ shimming problem may be considered as an overdetermined system of linear equations where the size of the shimming region of interest is one of the factors that determines the complexity of the problem.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method for subject-specific optimization of an RF pulse that improves the homogeneity of the B1+ field in the field-of-view, such as for UHF Mill, is provided. As another example, an improved method of acquiring magnetic resonance data of large slabs, such as from the human head, is provided.

According to a first aspect, the present embodiments are directed to a method for subject-specific optimization of an RF pulse for exciting spins in a slab in a magnetic resonance examination of a subject, where the RF pulse is to be played out with a coil having a plurality of independent parallel transmit elements, and each transmit element has a different complex B1+ field distribution. The method includes receiving complex B1+ field sensitivity maps for the plurality of parallel transmit elements and dividing the slab into at least two sub-slabs. The method also includes, for each sub-slab, performing B1+ shimming to optimize the RF shim settings for the plurality of parallel transmit elements, and combining the optimized RF shim settings for each sub-slab to create a multiband RF pulse that simultaneously excites the spins in the slab (e.g., in the whole slab).

The present embodiments have recognized that, due to the strong variations in the B1+ fields of the independent parallel transmit elements, it is difficult to fully compensate these variations over a large region of interest (ROI), such as a slab. The slab may be a region of interest that is excited together in three-dimensional (3D) imaging. The method splits the slab into smaller regions-of-interest (e.g., sub-slabs) and, by doing so, may optimize the RF shim settings over a smaller volume with less B1+ variations. These ROI-specific shim settings are more suited to combat the local B1+ inhomogeneities, leading to improved overall RF shimming when combined together. The method aims to utilize this notion and improve efficiency of the B1+ shimming by splitting the region of interest (e.g., the slab) into smaller volumes.

The method of the present embodiments is applied to optimize an RF pulse for exciting spins in a slab in a magnetic resonance examination of a subject. A "slab" is a region of interest from which a magnetic resonance (MR) signal is to be acquired. A slab may be a "thick slice" (e.g., may have a thickness of >15 mm, >20 mm, or >30 mm in slice-select direction). The slice-select direction may be the direction in which a magnetic field gradient is applied while the RF pulse is being played out.

According to an embodiment, the RF pulse is intended to excite spins in a slab as part of a three-dimensional (3D) imaging sequence. The 3D imaging sequence may be a gradient echo or a spin echo sequence. However, the RF pulse may also be intended to excite spins in a slab as part of an MR spectroscopy sequence. The RF pulse may be a volume selective pulse. The RF pulse may be any RF pulse required by an imaging or spectroscopy MR protocol (e.g., an excitation pulse of defined flip angle, where the flip angle may be between 20° and 90°, an inversion pulse, or a refocusing pulse).

The magnetic resonance examination may be carried out at high static field strengths (e.g., at a field strength $B_0$ of 3T or above), or ultra-high field strengths (e.g., at a field strength $B_0$ of 5T to 12T, 5T to 8T, or 7T). The method of the present embodiments is particularly suited for UHF MRI, because the method allows to provide improved B1+ homogeneity performance.

The subject may be a patient or volunteer, from whom MR data are to be acquired. The slab may be positioned within a field-of-view within a body part of the subject, such as the head, throat, abdomen, thorax, arm, leg, or other limb, or any other organ or body part of the subject. In an embodiment, the slab is positioned through the head. The method of the present embodiments may be carried out for a number of slabs through the body part, where the slabs may be contiguous or overlapping slightly in order to cover a larger field-of-view.

The RF pulse is designed to be played out with an RF coil having a plurality of independent parallel transmit elements, also referred to as transmit (Tx) channels. For example, the coil may have 8, 16, or 32 Tx channels. The RF coil may, for example, be a phased-array coil. The RF coil may be placed close to the body part from which MR data is to be acquired, as is usual in magnetic resonance examinations.

According to the present embodiments, a subject-specific optimization of the RF pulse is carried out. In other words, the RF pulse is not optimized on a phantom or on the basis of a general simulation. Rather, the RF pulse is optimized to the specific B1+ field distribution, which is influenced by the positioning of the RF coil with respect to the subject in this particular MR session. To this end, complex B1+ field sensitivity maps for the plurality of parallel transmit elements may be determined in the field-of-view during the same MR session, before carrying out the method of the present embodiments, as is known in the art. The complex B1+ maps may be obtained, for example, with a hybrid B1+ mapping technique as described in Van de Moortele P. F. et al. *"Calibration tools for RF shim at very high field with multiple element RF Coils: from ultra fast local relative phase to absolute magnitude B1+ mapping,"* Proceedings of the 15th Annual Meeting of ISMRM, Berlin, 2007, Abstract No. 1676. This method includes merging one absolute large flip angle |B1+| map measured with all coils transmitting together in a known RF shim setting, with $N_{Tx}$ complex, relative B1+ maps derived from small flip angle, multi-slice gradient echo images acquired with only one Tx element transmitting at a time. Other methods for obtaining subject-specific B1+ field sensitivity maps are described, for example, in the Thesis by Kawin Setsompop "Design Algorithms for Parallel Transmission in Magnetic Resonance Imaging," Massachusetts Institute of Technology, 2008, which is incorporated herein by reference.

The complex B1+ field sensitivity maps are used in performing B1+ shimming for each sub-slab in order to optimize the RF shim settings for this particular sub-slab. In one embodiment, static B1+ shimming is used to optimize the magnitudes and phases of the RF pulses for each Tx channel for each sub-slab separately. In other embodiments, the shape of the RF pulses may also be optimized for each sub-slab, which results in additional degrees of freedom that may be manipulated to improve excitation homogeneity.

Once the optimal RF shim settings have been determined for each sub-slab, the optimal RF shim settings are combined to create an RF pulse that simultaneously excites the spins in the complete slab. This RF pulse may be termed a multiband pulse, where each band excites one partition or sub-slab in the slab. Thus, the method of the present embodiments may be said to employ a multiband (MB) concept to divide a slab into smaller ROIs to enhance static or dynamic shimming performance. The optimization for static shimming is relatively fast, as no gradient is involved; still, the optimization is effective since the size of the ROI is reduced.

According to an embodiment, the B1+ shimming is a static B1+ shimming. In other words, the RF shim settings are constant during the RF pulse. Static RF shimming relies on the ability to control the overall amplitude and phase of the RF pulse that is being applied to each of the independent coil elements. With this technique, only the overall amplitude and phase and not the shape of the RF pulse are allowed to vary from transmit element to transmit element. In order to excite a slab, a sinc pulse with different amplitude and phase may be applied to each transmit element. A static RF shimming method is for example described in Mao W, Smith M B, Collins C M. "Exploring the limits of RF shimming for high-field MM of the human head," Magn. Reson. Med. 2006; 56(4): 918-922.

According to an alternative embodiment, the B1+ shimming is a dynamic B1+ shimming, where also the shape of the RF pulse may be optimized for each transmit element. In addition, gradients in the imaging plane (e.g., perpendicular to the slice select direction) may be played during the RF pulse to further improve the resultant B1+ homogeneity. For example, the RF pulse may be a spokes RF pulse including a train of sub-pulses (e.g., spokes) interleaved with gradient blips. The gradient blips determine the trajectory of a magnetization in transmit k-space so that each spoke is played at a specific position in transmit k-space. For example, a two-spokes pulse or a three-spokes pulse may be used as the RF pulse. For example, the method may be extended to be used in combination with a fast-kz spokes approach.

According to an embodiment, the B1+ shimming uses a magnitude-least-squares (MLS) optimization method. MLS optimization is a useful approach to obtain optimized magnitude and phases (e.g., RF shim settings) for the plurality of transmit elements. The technique is based on the following formula:

$$\hat{b} = \arg_b \min \left( \| |Ab| - |m| \|_w^2 + \lambda \|b\|^2 \right)$$

where m is a target excitation pattern, A is the encoding/design matrix, b is a vector representing the RF shim settings (e.g., the amplitude and phase with which each parallel transmit element is to be driven during the RF pulse), $\lambda$ is a regularization term to control total RF energy, and w is a weighting. The encoding matrix A incorporates the B1+ field sensitivity maps. Thus, the optimized shim settings $\hat{b}$ are obtained by minimizing the difference between the excitation pattern that will be generated by the RF shim settings b, and the target excitation pattern m (e.g., a homogeneous flip angle distribution over the sub-slab), while at the same time, also controlling the total RF energy deposited in the body, which is necessary to control the specific absorption rate (SAR) of the MM examinations. The minimization problem may be solved, for example, using conjugate-gradient methods. The MLS optimization method may be used in the context of static B1+ shimming. According to an embodiment, MLS is applied independently per sub-slab, and optimized magnitudes and phases for each transmit coil (also referred to as RF shim settings) are calculated iteratively. In the case of an MM examination involving a number of slabs, such as in multiple overlapping thin slab acquisition (MOTSA), this may be repeated for each slab. At the end of the B1+ shimming, $N_{sub-slab}*N_{Tx}$ complex variables have been generated for each slab, where $N_{sub-slab}$ is the number of sub-slabs and $N_{Tx}$ is the number of independent transmit elements. Other methods than MLS optimization for performing B1+ shimming and obtaining optimized magnitudes and phases for each transmit coil may also be provided by the present embodiments.

According to an embodiment, the slab is divided into two (2) to five (5) (e.g., two (2) to three (3)) sub-slabs in slice select direction. In other words, the slab is divided into thinner sub-slabs. In one embodiment, the number of sub-slabs per slab, also referred to as reduction factor, does not exceed five (5) (e.g., three (3)), because the RF peak and delivered power of the multiband RF pulse increases with the number of sub-slabs. Keeping the duration of the RF pulse short is important for many imaging sequences, especially with high resolution, in order to limit the overall acquisition time. For example, a TOF sequence with a whole brain high resolution 3D scan at 0.3 mm isotropic resolution will already take about 15 minutes acquisition time with acceleration.

According to an embodiment, the sub-slabs are contiguous and do not overlap. In other words, the slab is partitioned into a number of $N_{sub-slab}$ sub-slabs, and there are no gaps and no overlap between adjacent sub-slabs. The method of the present embodiments is only utilized for improved localized B1+ shimming, and not for the acceleration of acquisition, as is the case in MOTSA.

According to an embodiment, the optimized RF shim settings are combined by calculating an individual RF pulse for each sub-slab using the optimized RF shim setting, and summing the individual RF pulses to create a multiband RF pulse that simultaneously excites the spins in the complete slab. As mentioned above, at the end of a static B1+ shimming, $N_{sub-slab}*N_{Tx}$ complex variables may have been generated. These shim settings for each sub-slab are used to create an individual, phase modulated RF pulse. This may be done by applying the optimized complex weights/variables for the parallel transmit elements to the basic RF pulse profile (e.g., a sinc profile) to generate an individual, phase modulated RF pulse for each sub-slab. These phase modulated RF pulses may be combined in compliance with multiband excitation to generate a single multiband RF pulse, which will excite the spins in the complete slab. In an embodiment, the phase modulated RF pulses may be summed to create a multiband pulse where each band excites one partition/sub-slab in the slab.

According to an embodiment, the multiband RF pulse may be multiplied with a ramp profile in the frequency domain to create a tilted optimized non-saturating excitation (TONE) multiband parallel transmission RF pulse. The ramp profile may be linear, but other profiles are also possible, such as quadratic. Thereby, a flip angle ramp profile may be generated, which is a target excitation profile that is useful in TOF angiography. This is because, in 3D TOF MR angiography, the slabs are typically 50 m to 100 mm thick. The flow-related enhancement is highest for vessels just entering the slab. The further the blood has travelled into the slab, the more the blood becomes saturated by repetitive RF pulses. The relative saturation between the flowing blood and stationary tissue may be controlled by adjusting the flip angle, where the flip angle may be made to increase (e.g., linearly along the direction of flow) by using a TONE pulse. For example, the flip angle may be 20° at the entry slice, 30° at mid-slab, and 40° near the exiting slice.

According to another aspect, the present embodiments are also directed to a method for acquiring magnetic resonance data from a subject using a coil having a plurality of independent parallel transmit elements, where the magnetic resonance acquisition sequence includes at least one RF pulse for exciting the spins in a slab, which has been optimized as described herein.

All features and advantages that are described in relation to the method for optimization of the RF pulse may also apply to the method for acquiring magnetic resonance data, and vice versa.

The acquisition method may, for example, be carried out on an MR scanner operating at ultra-high field (e.g., at 5T or above, or at 7T or above).

The MR resonance data may be acquired using a three-dimensional acquisition sequence (e.g., a sequence in which a slab is excited), rather than a thin slice, and phase encoding is applied in the slice select direction in order to distinguish slices within the slab. 3D imaging has advantages in that 3D imaging may provide faster acquisition of large field-of-views.

The slab may have a thickness of 10 mm to 100 mm, 15 mm to 60 mm, or 20 mm to 50 mm in slice-select direction. These are thicknesses that are generally used in 3D imaging (e.g., of the human head).

According to an embodiment, the acquisition sequence is a TOF angiography sequence. In 3D time-of-flight (TOF) MR angiography, slabs of 50 mm to 100 mm thickness are to be excited simultaneously, resulting in the mentioned problems of B1+ inhomogeneity and accordingly, contrast variation. Therefore, TOF imaging particularly profits from the optimization method of the present embodiments.

According to an embodiment, the acquisition sequence involves the sequential acquisition of a number of overlapping slabs, where the RF pulses for exciting each slab have been optimized as described herein. Especially in TOF angiography, this technique is advantageous, because TOF is susceptible to saturation of slowly flowing blood in thick slabs. To combat this flow signal saturation, multiple overlapping thin slab acquisition (MOTSA) has been developed, as described in Parker, D. L., Yuan, C. & Blatter, D. D., "MR angiography by multiple thin slab 3D acquisition," Magn. Reson. Med. 17, (1991). MOTSA splits a thick slab into a sequence of thinner slabs that are acquired sequentially, while preserving spatial resolution and short echo time. Because of the lower slab thickness, loss of signal due to saturation effects is relatively limited, even at the exit slices. MOTSA thus offers a method to cover a relatively large anatomic area using 3D TOF with preserved intravascular signal intensity.

The method of the present embodiments may be combined with MOTSA for further improvement of B1+ shimming (e.g., every thin slab in MOTSA may be further petitioned into at least two sub-slabs, and an optimized multiband RF pulse may be generated for the thin MOTSA slab). The thin slabs in MOTSA may overlap slightly. Thus, the slab to be excited by the multiband RF pulse according to the present embodiments may be a MOTSA slab, which is typically less then 50 mm thick (e.g., 20 mm to 40 mm thick).

The present embodiments are also directed to a computer program including program code that causes a computer to carry out the optimization method according to the present embodiments when the computer program is executed on a computer. The method for subject specific optimization according to the present embodiments (e.g., optimization method) may be carried out by any computer (e.g., a control unit of magnetic resonance imaging (MM) system) or, alternatively, a CPU or GPU of a PC, or on a server, cloud computer, laptop, tablet computer, mobile device, or any other calculating unit.

According to another aspect, the invention is directed to a non-transient computer-readable medium comprising a computer program with instructions which, when carried out on a control unit of a magnetic resonance imaging system, will cause the magnetic resonance imaging system to carry out the optimization method or the acquisition method according to the invention. The computer readable medium may be any digital storage medium such as a hard disk, floppy disk, CD-ROM, USB stick, SD card, SSD card, cloud computer et cetera.

According to another aspect, the present embodiments are directed to a control unit for a magnetic resonance imaging system, where the control unit is configured to carry out the optimization method according to the present embodiments, and/or is configured to control a magnetic resonance imaging system to carry out the acquisition method according to the present embodiments. For example, the control unit may be configured to first optimize the RF pulse as described herein, and then also control an MRI scanner to acquire MR data from the subject using the described acquisition method.

The present embodiments are directed to a magnetic resonance imaging system including such a control unit. For example, the MRI system may operate at ultrahigh field strengths of 5T or above, or at 7T or above.

Any features and advantages of the computer program may be applied to the non-transient computer readable medium, the control unit, and the MRI system, and vice versa.

DETAILED DESCRIPTION

Figure 1:
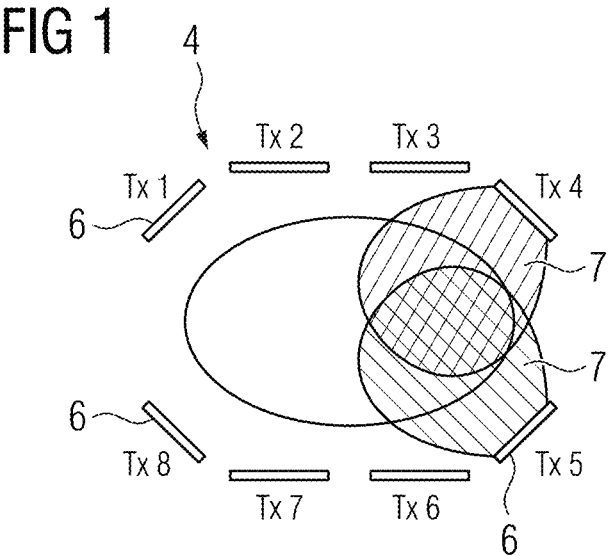
FIG. 1 is a schematic representation of a parallel transmit coil and the resulting B1+ field distribution.

FIG. 1 illustrates a parallel transmission coil for having eight (8) independent transmit elements 6 arranged around a subject 2, or, more precisely, around a field-of-view 2 within the subject. Each of the eight transmit elements 6 has an individual B1+ field distribution 7 that is shown in an exemplary fashion only for the transmit elements Tx4 and Tx5. By applying an individual phase and amplitude to an RF pulse played out by each transmit element 6, the B1+ field in the field-of-view 2 may be manipulated and optimized to achieve a target magnetization distribution. In static RF shimming, each transmit element 6 plays out of the same RF pulse, with a channel specific phase and amplitude applied. In dynamic RF shimming (e.g., dynamic parallel transmission), completely independent RF pulses with different profiles may be transmitted over the transmit elements 6.

Figure 2:
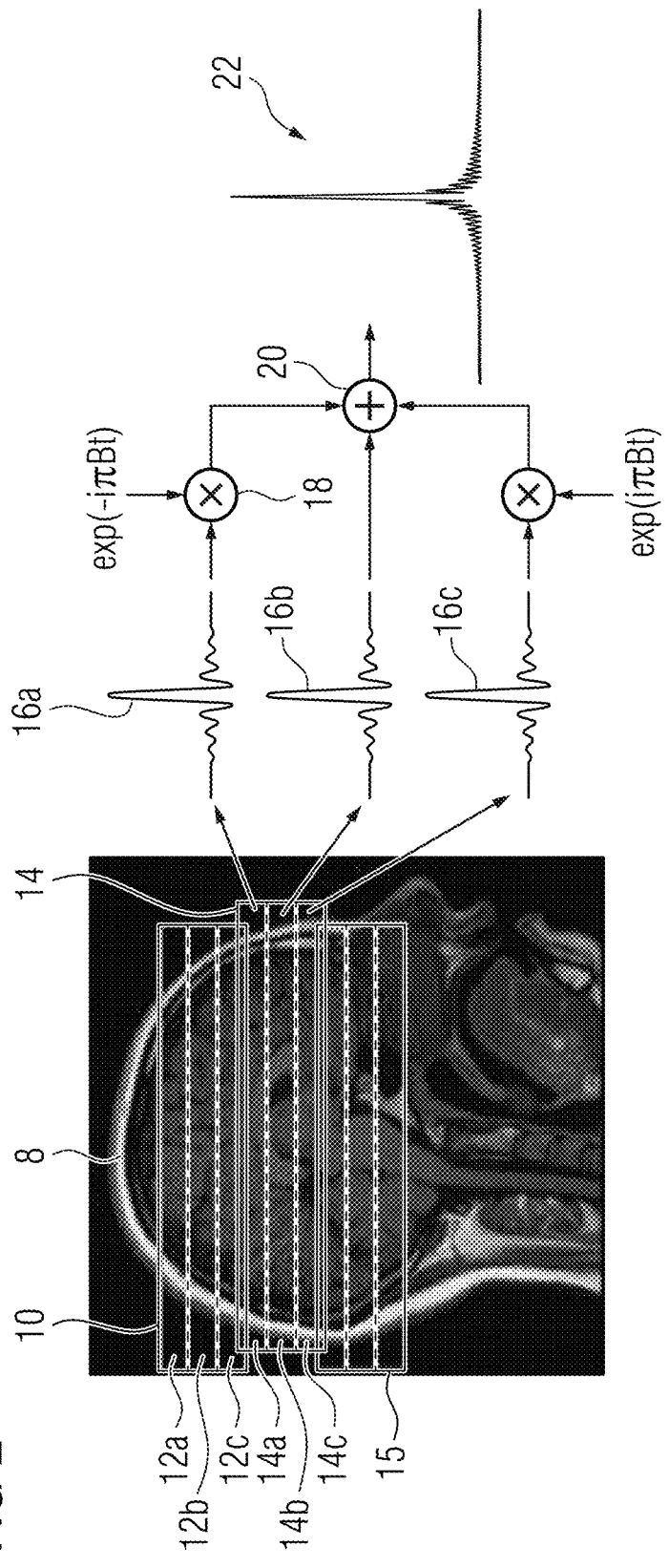
FIG. 2 shows a sagittal slice through a human head demonstrating the positioning of the slabs and sub-slab according to the present embodiments on the left, and the resulting individual RF pulses on the right.

FIG. 2 illustrates an embodiment, where a number of slabs 10, 14, 15 for time-of-flight angiography imaging of the brain are positioned on a sagittal slice through the human head. Looking at the top slab 10, the top slab 10 is further petitioned into three sub-slabs 12a, 12b, and 12c. The same holds for another slab 14 that is positioned below and slightly overlapping with slab 10 (e.g., for a TOF MOTSA imaging protocol). Slab 14 is also divided into three sub-slabs 14a, 14b, 14c, as is a further slab 15 that is positioned below and slightly overlapping with slab 14. Thus, every MOTSA thin slab 10, 14, 15 is further partitioned to allow for localized B1+ shimming. As a result of the RF shimming for each sub-slab 14a, 14b, 14c, three individual RF shim settings with different magnitudes and phases for each of the parallel transmit channels 6 is the result, and the individual, amplitude- and phase-modulated RF pulses pertaining to each sub-slab 14a, 14b, 14c are illustrated at 16a, 16b, and 16b in the time domain. The RF pulse 16a pertaining to the top sub-slab 14a is multiplied in the time domain by $\exp(-i\pi Bt)$, where B is a pre-determined frequency or frequency range. The RF pulse 16c pertaining to the bottom sub-slab 14c is multiplied in the time domain by $\exp(i\pi Bt)$, where B is a pre-determined frequency or frequency range. This is done to shift the frequency of the pulse, so that the three pulses 16a, 16b, 16c excite spins in different locations (e.g., different sub-slabs; shifted along the slice select direction). In an embodiment, B may represent the bandwidth of the RF pulse (e.g., a sinc pulse). After this multiplication 18, the individual modulated RF pulses 16a, 16b, 16c are summed up in act 22 to create a multiband RF pulse 22, where each band excites one petition in the slab 14.

Figure 3:
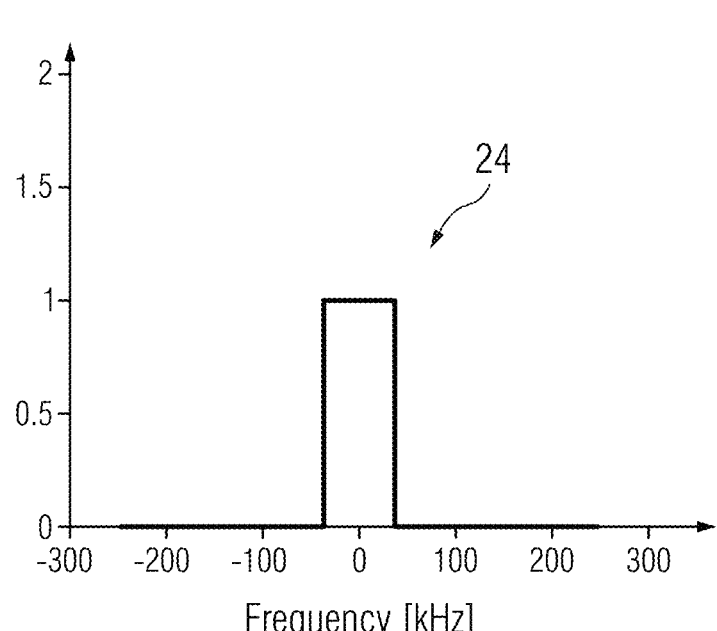
FIG. 3 shows the profile of a multiband RF pulse according to the present embodiments in the frequency domain.
Figure 4:
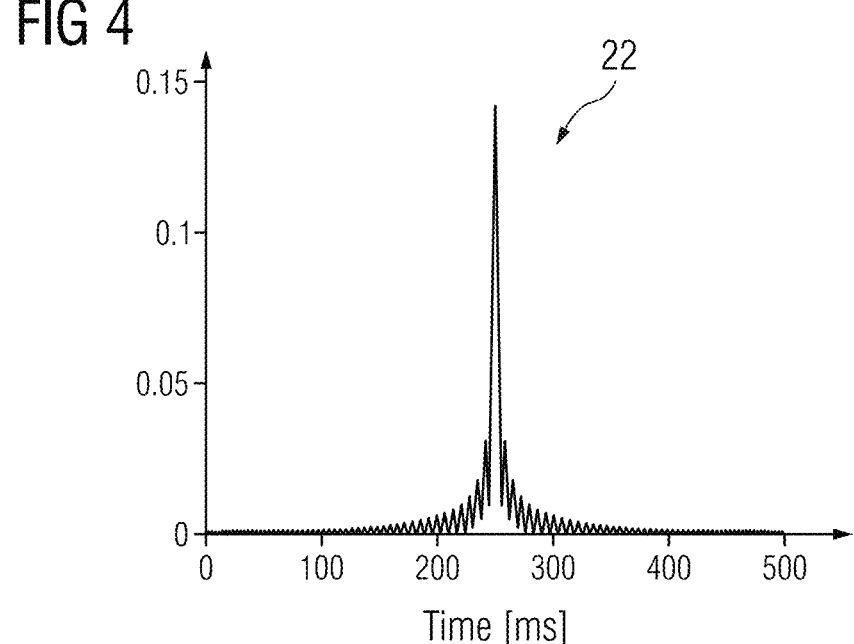
FIG. 4 shows the multiband RF pulse of FIG. 3 in the time domain.

FIG. 3 illustrates a profile 24 in the frequency domain of a multiband RF pulse that is to excite a slab 10, 14, 15 according to the present embodiments. The same RF pulse 22 is shown in the time domain in FIG. 4. The RF pulse 22 is a multiband pulse generated from the superposition of a number of phase modulated sinc pulses.

Figure 5:
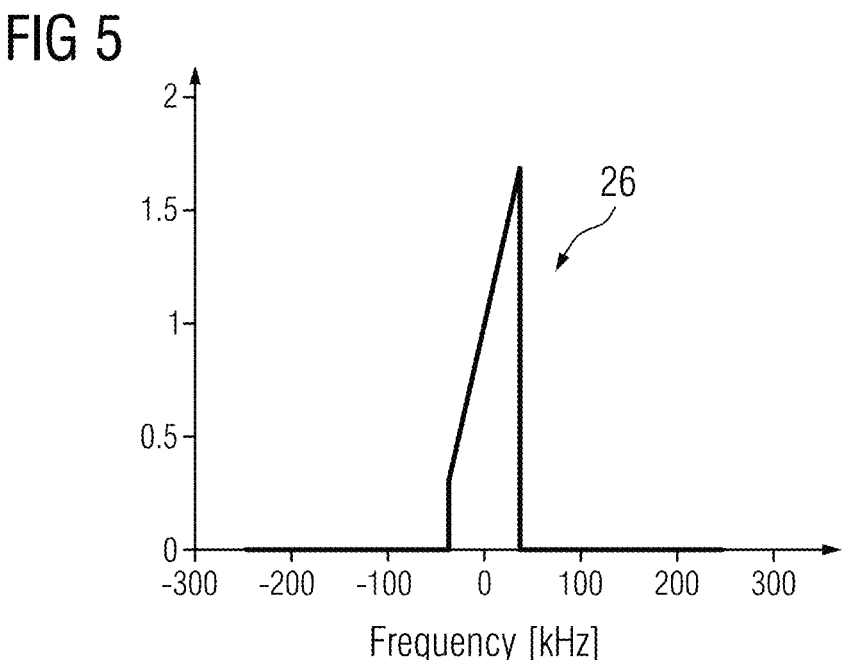
FIG. 5 shows a multiband RF pulse profile having a TONE pulse waveform in the frequency domain.

In FIG. 5, a TONE RF pulse profile 26 is illustrated in the frequency domain, which was generated from the multiband RF pulse 24 shown in FIG. 3. The multiband RF pulse 24 in the frequency or Fourier domain is multiplied by a ramp profile to create a TONE pulse waveform 26, which is shown in FIG. 5.

Figure 6:
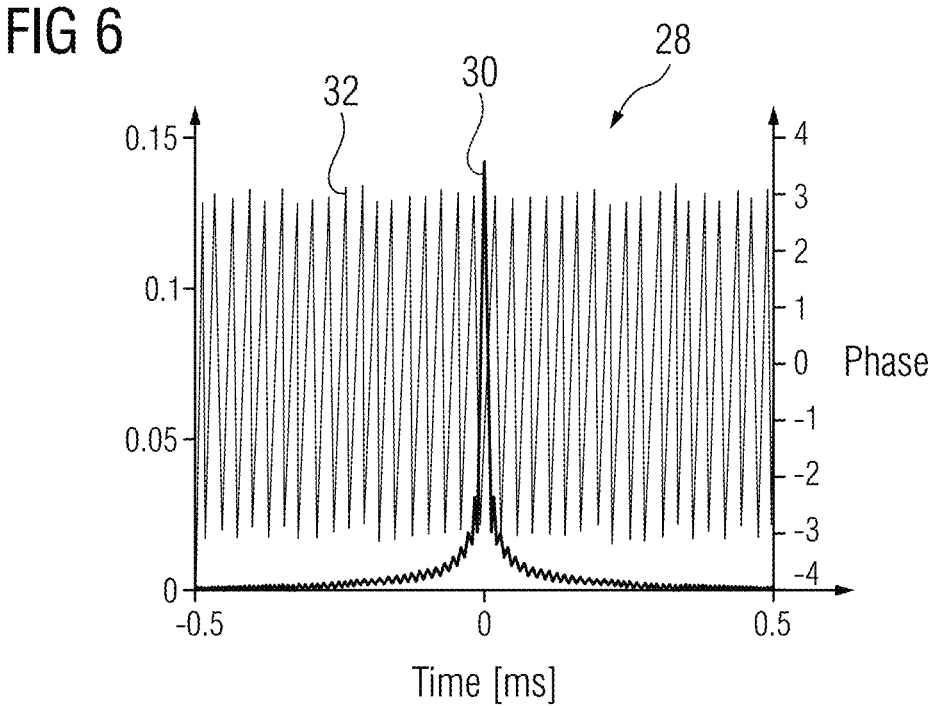
FIG. 6 shows the multiband RF pulse of FIG. 5 in the time domain.

FIG. 6 shows the profile 28 of the TONE RF pulse 26 in the time domain, where the RF amplitude is shown at 30, and the phase at 32.

Figure 7:
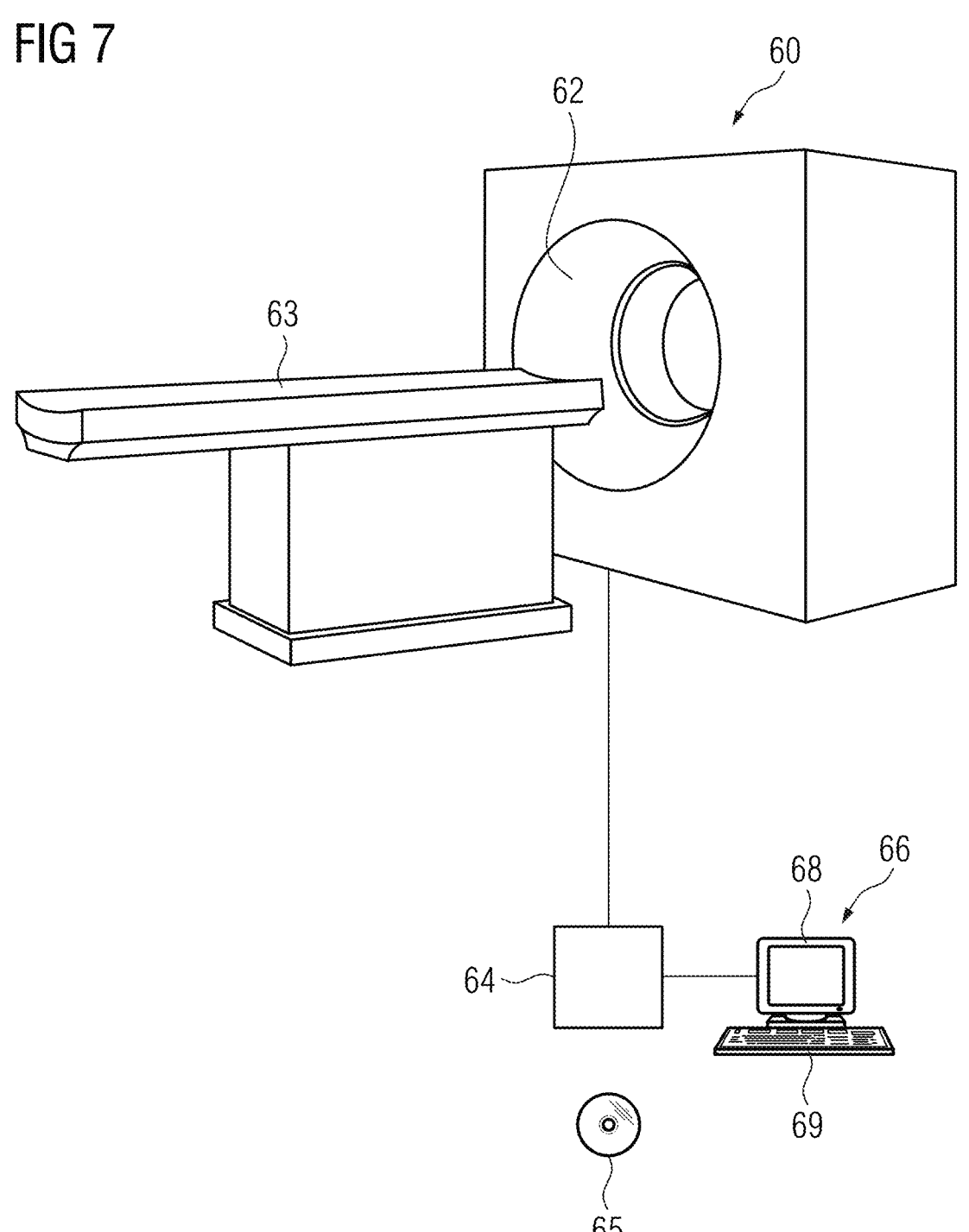
FIG. 7 is a schematic representation of an MRI system according to an embodiment.

FIG. 7 shows a magnetic resonance system 60 that is configured to carry out the optimization method or the acquisition method according to the present embodiments. The magnetic resonance system 60 has a scanner 62 that includes a parallel transmit coil (not shown), as known in the art. A patient or subject may be positioned on patient bed 63. The Mill scanner 62 is controlled by the control unit 64, which includes a processing unit (e.g., a processor). The control unit 64 is connected to a user interface 66 that may include screen 68 and a keyboard 69 to input and output user interactions. A computer program including program code that causes the control unit 64 to carry out the optimization method or to drive the magnetic resonance system 60 to carry out the acquisition method according to the present embodiments, when the computer program is executed on the control unit, is illustrated at 65.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for subject-specific optimization of a radio frequency (RF) pulse for exciting spins in a slab of a number of overlapping slabs in a magnetic resonance examination of a subject including sequential acquisition of the number of overlapping slabs, wherein the RF pulse is to be played out with a coil having a plurality of independent parallel transmit elements, each transmit element of the plurality of independent parallel transmit elements having a different complex B1+ field distribution, the method comprising:

receiving complex B1+ field sensitivity maps for the plurality of independent parallel transmit elements;

dividing the slab into at least two sub-slabs;

for each sub-slab of the at least two sub-slabs, performing B1+ shimming, such that RF shim settings for the plurality of independent parallel transmit elements are optimized; and combining the optimized RF shim settings for each sub-slab, such that a multiband RF pulse that simultaneously excites the spins in the slab is created, wherein the at least two sub-slabs are contiguous and do not overlap.

2. The method of claim 1, wherein the B1+ shimming is a static B1+ shimming.

3. The method of claim 2, wherein the B1+ shimming is a static B1+ shimming using a magnitude-least-squares optimization method.

4. The method of claim 1, wherein the slab is divided into two to five sub-slabs in a slice-select direction.

5. The method of claim 1, wherein the slab is divided into two to three sub-slabs in a slice-select direction.

6. The method of claim 1, wherein combining the optimized RF shim settings comprises:

calculating an individual RF pulse for each sub-slab of the at least two sub-slabs using the optimized RF shim setting; and summing the individual RF pulses, such that a multiband RF pulse that simultaneously excites the spins in a complete slab is created.

7. The method of claim 6, further comprising multiplying the multiband RF pulse with a ramp profile in the frequency domain, such that a tilted optimized non-saturating excitation (TONE) multiband parallel transmission RF pulse is created after the optimized RF shim settings are combined.

8. A method for acquiring magnetic resonance data from a subject using a coil having a plurality of independent parallel transmit elements, each transmit element of the plurality of independent parallel transmit elements having a different complex B1+ field distribution, the method comprising:

generating a magnetic resonance acquisition sequence comprising at least one radio frequency (RF) pulse that has been optimized, the at least one RF pulse being for exciting spins in a slab of a number of overlapping slabs, wherein the magnetic resonance acquisition sequence involves a sequential acquisition of the number of overlapping slabs, wherein the optimization of the at least one RF pulse comprises:

receipt of complex B1+ field sensitivity maps for the plurality of independent parallel transmit elements;

division of the slab into at least two sub-slabs;

for each sub-slab of the at least two sub-slabs, performance of B1+ shimming, such that RF shim settings for the plurality of independent parallel transmit elements are optimized; and combination of the optimized RF shim settings for each sub-slab, such that a multiband RF pulse that simultaneously excites the spins in the slab is created, wherein the at least two sub-slabs are contiguous and do not overlap.

9. The method of claim 8, wherein the slab has a thickness of 10 mm to 100 mm in a slice-select direction.

10. The method of claim 9, wherein the slab has a thickness of 15 mm to 60 mm in the slice-select direction.

11. The method of claim 9, wherein the slab has a thickness of 20 mm to 50 mm in the slice-select direction.

12. The method of claim 8, wherein the magnetic resonance acquisition sequence is a three-dimensional imaging sequence.

13. The method of claim 8, wherein the magnetic resonance acquisition sequence is a time-of-flight angiography sequence.

14. In a non-transient computer-readable storage medium that stores instructions executable by a control unit of a magnetic resonance imaging system for subject-specific optimization of a radio frequency (RF) pulse for exciting spins in a slab of a number of overlapping slabs in a magnetic resonance examination of a subject including sequential acquisition of the number of overlapping slabs, wherein the RF pulse is to be played out with a coil having a plurality of independent parallel transmit elements, each transmit element of the plurality of independent parallel transmit elements having a different complex B1+ field distribution, the instructions comprising:

receiving complex B1+ field sensitivity maps for the plurality of independent parallel transmit elements;

dividing the slab into at least two sub-slabs;

for each sub-slab of the at least two sub-slabs, performing B1+ shimming, such that RF shim settings for the plurality of independent parallel transmit elements are optimized; and combining the optimized RF shim settings for each sub-slab, such that a multiband RF pulse that simultaneously excites the spins in the slab is created, wherein the at least two sub-slabs are contiguous and do not overlap.

15. A control unit for a magnetic resonance imaging system, the control unit comprising:

a processor configured to:

subject-specific optimize a radio frequency (RF) pulse for exciting spins in a slab of a number of overlapping slabs in a magnetic resonance examination of a subject including sequential acquisition of the number of overlapping slabs, wherein the RF pulse is to be played out with a coil having a plurality of independent parallel transmit elements, each transmit element of the plurality of independent parallel transmit elements having a different complex B1+ field distribution, the subject-specific optimization comprising:

receipt of complex B1+ field sensitivity maps for the plurality of independent parallel transmit elements;

division of the slab into at least two sub-slabs;

for each sub-slab of the at least two sub-slabs, performance of B1+ shimming, such that RF shim settings for the plurality of independent parallel transmit elements are optimized; and combination of the optimized RF shim settings for each sub-slab, such that a multiband RF pulse that simultaneously excites the spins in the slab is created, wherein the at least two sub-slabs are contiguous and do not overlap.

16. A magnetic resonance imaging system comprising:

a control unit comprising:

a processor configured to:

subject-specific optimize a radio frequency (RF) pulse for exciting spins in a slab of a number of overlapping slabs in a magnetic resonance examination of a subject including sequential acquisition of the number of overlapping slabs, wherein the RF pulse is to be played out with a coil having a plurality of independent parallel transmit elements, each transmit element of the plurality of independent parallel transmit elements having a different complex B1+ field distribution, the subject-specific optimization comprising:

receipt of complex B1+ field sensitivity maps for the plurality of independent parallel transmit elements;

division of the slab into at least two sub-slabs;

for each sub-slab of the at least two sub-slabs, performance of B1+ shimming, such that RF shim settings for the plurality of independent parallel transmit elements are optimized; and combination of the optimized RF shim settings for each sub-slab, such that a multiband RF pulse that simultaneously excites the spins in the slab is created, wherein the at least two sub-slabs are contiguous and do not overlap.

* * * * *